(12) United States Patent
Gao et al.

(10) Patent No.: US 12,738,625 B2
(45) Date of Patent: Sep. 15, 2026

(54) COUPLER AND ELECTRONIC DEVICE

(71) Applicant: HUAWEI TECHNOLOGIES CO., LTD., Shenzhen (CN)

(72) Inventors: Peng Gao, Shanghai (CN); Xianlin Wei, Shanghai (CN); Youbing Pan, Shanghai (CN); Yi Xu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 435 days.

(21) Appl. No.: 18/542,619

(22) Filed: Dec. 16, 2023

(65) Prior Publication Data

US 2024/0120632 A1 Apr. 11, 2024

Related U.S. Application Data

(63) Continuation of application No. PCT/CN2022/097468, filed on Jun. 7, 2022.

(30) Foreign Application Priority Data

Jun. 30, 2021 (CN) ......................... 202110742468.8

(51) Int. Cl.

| | |
|---|---|
| ***H01P 5/19*** | (2006.01) |
| ***H01P 1/38*** | (2006.01) |
| ***H05K 1/02*** | (2006.01) |
| ***H05K 1/11*** | (2006.01) |
| *H01P 3/08* | (2006.01) |

(52) U.S. Cl.

CPC .................. *H01P 5/19* (2013.01); *H01P 1/38* (2013.01); *H05K 1/0243* (2013.01); *H05K 1/115* (2013.01); *H01P 3/08* (2013.01)

(58) Field of Classification Search

CPC ..... H01P 5/19; H01P 1/38; H01P 3/08; H05K 1/0243; H05K 1/115

See application file for complete search history.

(56) References Cited

U.S. PATENT DOCUMENTS

| | | | | |
|---|---|---|---|---|
| 5,233,318 | A | 8/1993 | Sasaki et al. | |
| 2007/0103253 | A1 | 5/2007 | Napijalo | |
| 2011/0070882 | A1 * | 3/2011 | Cheng ................ | H04W 52/367 455/424 |

(Continued)

FOREIGN PATENT DOCUMENTS

| | | | |
|---|---|---|---|
| CN | 200997602 | Y | 12/2007 |
| CN | 101566642 | A | 10/2009 |

(Continued)

*Primary Examiner* — Raymond S Dean

(57) ABSTRACT

A coupler for use in a wireless communication device includes a signal input end, a signal output end, a coupling end, an isolation end, a main signal hole, and a first coupling hole disposed on a PCB. A first end of the main signal hole is coupled to the signal input end. A second end of the main signal hole is coupled to the signal output end. A first end of the first coupling hole is coupled to the coupling end. A second end of the first coupling hole is coupled to the isolation end. In a thickness direction of the PCB, the first end of the first coupling hole and the first end of the main signal hole are close to a first side of the PCB, and the second end of the first coupling hole and the second end of the main signal hole are close to a second side of the PCB.

20 Claims, 9 Drawing Sheets

(56) References Cited

U.S. PATENT DOCUMENTS

2014/0361953 A1* 12/2014 Spokoinyi ............... H01P 5/184
343/905
2016/0255183 A1* 9/2016 Ho ....................... H04B 1/3816
455/558
2020/0028233 A1* 1/2020 Chen ......................... H01P 5/16
2020/0364567 A1* 11/2020 Oh ....................... G06N 3/0464

FOREIGN PATENT DOCUMENTS

CN 110011020 A * 7/2019 ................ H01P 5/16
CN 113113753 A 7/2021
CN 113497326 A 10/2021

* cited by examiner

COUPLER AND ELECTRONIC DEVICE

CROSS-REFERENCE TO RELATED APPLICATIONS

This application is a continuation of International Application PCT/CN2022/097468, filed on Jun. 7, 2022, which claims priority to Chinese Patent Application No. 202110742468.8, filed on Jun. 30, 2021. The disclosures of the aforementioned priority applications are hereby incorporated by reference in their entirety.

TECHNICAL FIELD

This application relates to the field of electronic devices, and in particular, to a coupler and an electronic device.

BACKGROUND

With rapid evolution of wireless products, there is an increasingly strong requirement for miniaturization of communication devices such as a base station. Therefore, miniaturization of active and passive components is required in design. Currently, a plurality of miniaturization design solutions have been tried for an active circuit. For example, a miniaturization design solution is implemented by using a radio frequency front end module (RFFEM) chip, a radio frequency transmit power amplifier module, and the like. The active circuit will further evolve to miniaturization in the future. In this context, the miniaturization of the passive component will become a key technology bottleneck in the evolution to miniaturization.

A coupler is a most widely used passive component in a wireless communication product. Currently, all technical solutions of the coupler are based on a microstrip/strip wire form on a planar printed circuit board (PCB). Usually, a coupler function is implemented through electromagnetic coupling between two strip wires that are arranged on a PCB plane and close to each other. Because a strip-shaped wire of a specific electrical length is required, the coupler has a large size on an X-Y plane (vertical to a Z direction of a PCB thickness), and occupies a large PCB layout area. This cannot meet a miniaturization requirement.

SUMMARY

Embodiments of this application provide a coupler and an electronic device, which occupy a smaller PCB layout area, and are more conducive to a requirement for miniaturization of a device.

To achieve the foregoing objective, this application uses the following technical solutions.

According to a first aspect, a coupler is provided. The coupler includes a signal input end, a signal output end, a coupling end, and an isolation end, the coupler is configured to couple a signal transmitted on a path between the signal input end and the signal output end to a path between the coupling end and the isolation end, and the coupler further includes a main signal hole disposed on a printed circuit board PCB and a first coupling hole disposed on the PCB; and a first end of the main signal hole is coupled to the signal input end, a second end of the main signal hole is coupled to the signal output end, a first end of the first coupling hole is coupled to the coupling end, a second end of the first coupling hole is coupled to the isolation end, and in a thickness direction of the PCB, the first end of the first coupling hole and the first end of the main signal hole are close to a first side of the PCB, and the second end of the first coupling hole and the second end of the main signal hole are close to a second side of the PCB. The main signal hole is used as a main signal path of the coupler, and the first coupling hole is used as a coupling signal path of the coupler. When a signal current is input from the signal input end to the main signal hole, the signal current is output from the signal output end through the main signal hole. An isolation end of the first coupling hole is connected to a ground end. In this way, the first coupling hole generates a coupling current opposite to the first coupling hole according to the left-hand rule (induced current), and outputs the coupling current from the coupling end, to implement a function of the coupler. In this embodiment of this application, because both the main signal path and the coupling signal path of the coupler are implemented in a form of a via on the PCB, and vias on the PCB are usually distributed along the thickness direction of the PCB, compared with a coupler that is currently implemented by using strip-shaped wiring disposed on a PCB plane, the coupler provided in this embodiment of this application occupies a smaller PCB layout area. This is more conducive to the requirement for miniaturization of the device.

In a possible implementation, the coupler includes a second coupling hole and a layer change hole that are disposed on the PCB, where the layer change hole is connected in series between the first coupling hole and the second coupling hole; a first end of the layer change hole is coupled to the second end of the first coupling hole through a first line of a first layer in the PCB, a second end of the layer change hole is coupled to a first end of the second coupling hole through a second line of a second layer in the PCB, and a second end of the second coupling hole is coupled to the isolation end; and in the thickness direction of the PCB, the first end of the second coupling hole and the second end of the layer change hole are close to the first side of the PCB, and the second end of the second coupling hole and the first end of the layer change hole are close to the second side of the PCB. In this implementation, to improve a coupling degree between the main signal path and the coupling signal path of the coupler, a plurality of coupling holes may be disposed. The plurality of coupling holes are connected in series by using the layer change hole, so that more energy can be coupled from the main signal path.

In a possible implementation, the coupling end and the isolation end are respectively located at two ends of the first coupling hole. In this way, for ease of connection, a device connected to a coupling end CO and a ground end are both located on a same side of the PCB. The coupler further includes a layer change hole disposed on the PCB, where a first end of the layer change hole is coupled to the first end of the first coupling hole through a first line of a first layer in the PCB, and a second end of the layer change hole is coupled to the coupling end; and in the thickness direction of the PCB, the first end of the layer change hole is close to the first side of the PCB, and the second end of the layer change hole is close to the second side of the PCB. In this way, the coupling end and the isolation end may be led out on the same side of the PCB, to facilitate connection with another component.

In a possible implementation, to improve the coupling degree of the coupler, a distance between the first coupling hole and the main signal hole and a distance between the second coupling hole and the main signal hole may be as short as possible. For example, the distance between the first coupling hole and the main signal hole is less than a first threshold. Alternatively, the distance between the second coupling hole and the main signal hole is less than a first threshold.

In a possible implementation, to prevent a signal coupled through the layer change hole from directly canceling a signal on the coupling signal path, to reduce the coupling degree of the coupler, a distance between the layer change hole and the main signal hole may be extended as far as possible. The distance between the layer change hole and the main signal hole is greater than a distance between the first coupling hole and the main signal hole. Alternatively, the distance between the layer change hole and the main signal hole is greater than a distance between the second coupling hole and the main signal hole.

In a possible implementation, to prevent a signal coupled through the layer change hole from directly canceling a signal on the coupling signal path, to reduce the coupling degree of the coupler, a reference ground is disposed between the layer change hole and the main signal hole; and/or a reference ground is disposed between the layer change hole and the first coupling hole; and/or, a reference ground is disposed between the layer change hole and the second coupling hole.

In a possible implementation, the main signal hole is used as the main signal path of the coupler, and the first coupling hole is used as the coupling signal path of the coupler. When a signal current is input from the signal input end to the main signal hole, the signal current is output from the signal output end through the main signal hole. Therefore, a coupling current I1 is generated on the second coupling hole. The current I1 is transmitted from the second coupling hole to the layer change hole through the second line, and is transmitted to the first coupling hole through the first line after layer change through the layer change hole. The current I1 is superposed on a current I2 coupled through the first coupling hole to form a current Ia11, and the current Ia11 is output from the coupling end after being transmitted through the second coupling hole. It should be noted that a phase change occurs when the current I1 flows through the first line, the layer change hole, and the second line. To avoid direct cancellation between the current I1 and the current I2, a phase difference between signals in the first coupling hole and the second coupling hole is less than 180°. That is, a phase shift generated when a signal on the second coupling hole passes through the second line, the layer change hole, and the first line is less than 180°.

In a possible implementation, to ensure the coupling degree of the coupler, extension directions of the main signal hole and the first coupling hole are parallel to the thickness direction of the PCB. In this way, when the first coupling hole is parallel to the main signal hole, the first coupling hole can effectively couple most energy in the main signal hole.

In a possible implementation, an extension direction of the second coupling hole is parallel to the thickness direction of the PCB.

In a possible implementation, an extension direction of the layer change hole is parallel to the thickness direction of the PCB.

According to a second aspect, a radio frequency circuit board is provided, including a printed circuit board PCB and a coupler disposed on the PCB, where the coupler includes a signal input end, a signal output end, a coupling end, and an isolation end, the coupler is configured to couple a signal transmitted on a path between the signal input end and the signal output end to a path between the coupling end and the isolation end, the coupler further includes a main signal hole disposed on the printed circuit board PCB and a first coupling hole disposed on the PCB, a first end of the main signal hole is coupled to the signal input end, a second end of the main signal hole is coupled to the signal output end, a first end of the first coupling hole is coupled to the coupling end, a second end of the first coupling hole is coupled to the isolation end, and in a thickness direction of the PCB, the first end of the first coupling hole and the first end of the main signal hole are close to a first side of the PCB, and the second end of the first coupling hole and the second end of the main signal hole are close to a second side of the PCB. The signal input end of the coupler is coupled to an output end of a radio frequency amplifier, and the signal output end of the coupler is coupled to an input end of a duplexer; and/or the signal input end of the coupler is coupled to an output end of the duplexer, and the signal output end of the coupler is coupled to an antenna.

In a possible implementation, the coupler further includes a second coupling hole and a layer change hole that are disposed on the PCB, where the layer change hole is connected in series between the first coupling hole and the second coupling hole; a first end of the layer change hole is coupled to the second end of the first coupling hole through a first line of a first layer in the PCB, a second end of the layer change hole is coupled to a first end of the second coupling hole through a second line of a second layer in the PCB, and a second end of the second coupling hole is coupled to the isolation end; and in the thickness direction of the PCB, the first end of the second coupling hole and the second end of the layer change hole are close to the first side of the PCB, and the second end of the second coupling hole and the first end of the layer change hole are close to the second side of the PCB.

In a possible implementation, the coupler further includes a layer change hole disposed on the PCB, a first end of the layer change hole is coupled to the first end of the first coupling hole through a first line of a first layer in the PCB, and a second end of the layer change hole is coupled to the coupling end; and in the thickness direction of the PCB, the first end of the layer change hole is close to the first side of the PCB, and the second end of the layer change hole is close to the second side of the PCB.

In a possible implementation, a distance between the layer change hole and the main signal hole is greater than a distance between the first coupling hole and the main signal hole.

In a possible implementation, a distance between the layer change hole and the main signal hole is greater than a distance between the second coupling hole and the main signal hole.

In a possible implementation, a reference ground is disposed between the layer change hole and the main signal hole.

In a possible implementation, a reference ground is disposed between the layer change hole and the first coupling hole.

In a possible implementation, a reference ground is disposed between the layer change hole and the second coupling hole.

In a possible implementation, a circulator is further coupled between the signal input end of the coupler and the output end of the radio frequency amplifier.

In a possible implementation, a phase shifter is further coupled between the signal output end of the coupler and the antenna.

According to a third aspect, a radio frequency amplifier is provided, including a printed circuit board PCB, a power amplifying transistor disposed on the PCB, and the coupler provided in the first aspect, where the signal input end of the coupler is coupled to an output end of the power amplifying transistor.

According to a fourth aspect, an electronic device is provided, including the coupler provided in the first aspect, where the signal input end of the coupler is coupled to an output end of a radio frequency amplifier, and the signal output end of the coupler is coupled to an input end of a duplexer; or the signal input end of the coupler is coupled to an output end of the duplexer, and the signal output end of the coupler is coupled to an antenna.

In a possible implementation, a circulator is further coupled between the signal input end of the coupler and the output end of the radio frequency amplifier.

In a possible implementation, a phase shifter is further coupled between the signal output end of the coupler and the antenna.

For technical effects brought by any one of the second aspect, the third aspect, and the fourth aspect, refer to technical effects brought by different implementations of the first aspect. Details are not described herein again.

BRIEF DESCRIPTION OF DRAWINGS

To describe the technical solutions in embodiments of this application or in the background more clearly, the following describes the accompanying drawings for describing embodiments of this application or the background.

DESCRIPTION OF EMBODIMENTS

The following describes the technical solutions in embodiments of this application with reference to the accompanying drawings in embodiments of this application. It is clear that the described embodiments may be a part rather than all of embodiments of this application.

Unless defined otherwise, all technical and scientific terms used herein have the same meaning as commonly understood by a person of ordinary skill in the art to which this disclosure belongs. In this application, "at least one" means one or more, and "a plurality of" means two or more. "And/or" describes an association relationship between associated objects, and represents that three relationships may exist. For example, A and/or B may represent the following cases: Only A exists, both A and B exist, and only B exists, where A and B may be singular or plural. The character "/" generally indicates an "or" relationship between the associated objects. At least one of the following items (pieces) or a similar expression thereof refers to any combination of these items, including any combination of singular items (pieces) or plural items (pieces). For example, at least one of a, b, or c may represent: a, b, c, a and b, a and c, b and c, or a, b, and c, where a, b, and c may be singular or plural. In addition, in embodiments of this application, the terms such as "first" and "second" are not intended to limit a quantity or an execution sequence.

It should be noted that, in this application, terms such as "example" or "for example" are used to represent an example, an instance, or an illustration. Any embodiment or design scheme described as "example" or "for example" in this application should not be construed as being more preferred or advantageous than other embodiments or design schemes. Exactly, use of the word "example", "for example", or the like is intended to present a related concept in a specific manner.

In this application, unless otherwise specified and limited, the term "coupling" may be a manner of implementing an electrical connection for signal transmission, and the term "coupling" may be a direct electrical connection, or may be an indirect electrical connection by using an intermediate medium.

First, a structure of a printed circuit board PCB in an embodiment of this application is described as follows.

Figure 1:
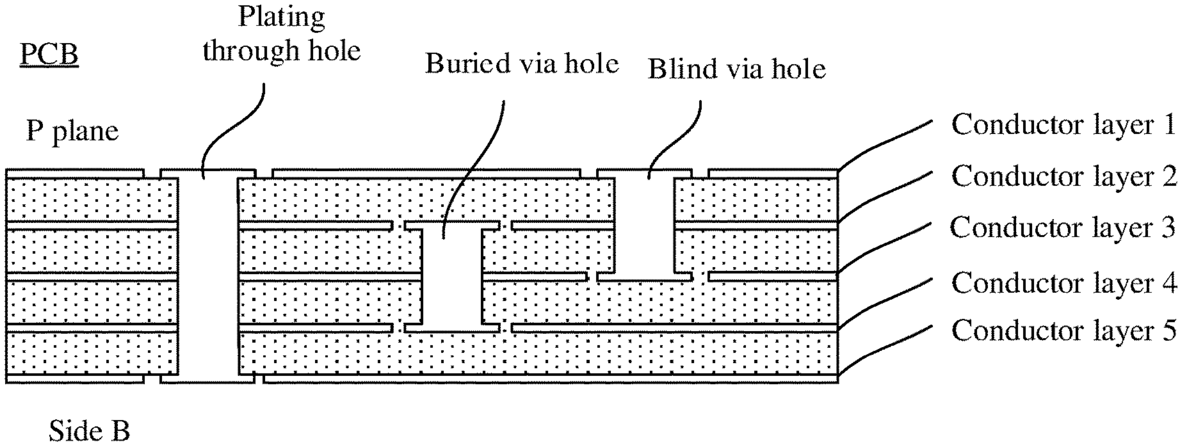
FIG. 1 is a schematic diagram of a structure of a PCB according to an embodiment of this application.

Refer to FIG. 1. A structure of a multilayer PCB is provided, which includes a plurality of superimposed conductor layers (or circuit layers), where two adjacent conductor layers are bonded by using an insulation medium (for example, a resin material). The PCB shown in FIG. 1 includes five conductor layers from a P side to a B side. Different conductor layers are electrically connected through a via. The via is made by drilling a hole on the PCB, and then a drilled surface is electroplated with a conductive material (for example, copper), so that a current can flow between two conductor layers connected through the via. In addition, as shown in FIG. 1, the via includes a plating through hole (PTH), a blind via hole (BVH), and a buried via hole (BVH). Drilling of the plating through hole is usually drilling through the PCB. The plating through hole is configured to connect two outermost conductor layers (for example, a conductor layer 1 and a conductor layer 5 in FIG. 1) of the PCB. Drilling of the blind via hole is usually drilling from one side of the PCB, and the PCB is not drilled through. The blind via hole is configured to connect an outermost conductor layer of the PCB to an inner conductor layer (for example, the conductor layer 1 and a conductor layer 3 in FIG. 1) of the PCB. Drilling of the buried via hole is usually drilling inside the PCB. The buried via hole is usually made by drilling an insulation medium that needs to be deposed with the buried via hole in an insulation medium bonding process. The buried via hole is configured to connect two inner conductor layers (for example, a conductor layer 2 and a conductor layer 4 in FIG. 1) of the PCB. In the following embodiments of this application, the main signal hole, the first coupling hole, the second coupling hole, and the layer change hole that are provided all belong to the scope of the foregoing via. Certainly, based on an actual requirement, the main signal hole, the first coupling hole, the second coupling hole, and the layer change hole are not limited to a plating through hole, a blind via hole, or a buried via hole.

A basic principle of a coupler provided in this embodiment of this application is described as follows.

Figure 2:
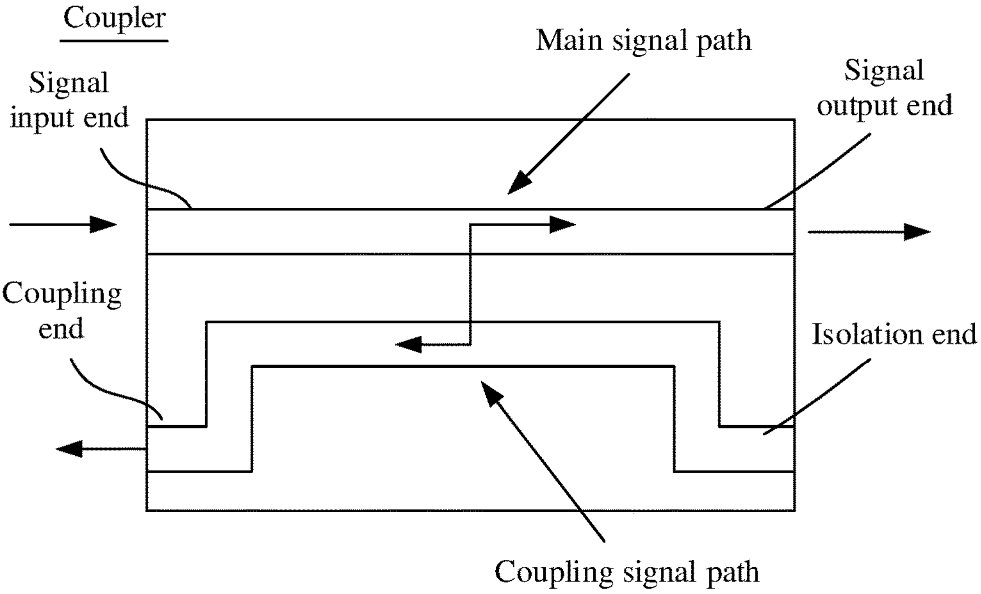
FIG. 2 is a schematic diagram of a structure of a coupler according to an embodiment of this application.

The coupler provided in this embodiment of this application is a passive radio frequency device. As shown in FIG. 2, the coupler includes a signal input end, a signal output end, an isolation end, and a coupling end. A path (a main signal path) between the signal input end and the signal output end is placed in parallel with a path (a coupling signal path) between the coupling end and the isolation end. In this way, a part of energy may be coupled (extracted) from the main signal path between the signal input end and the signal output end through the coupling signal path between the coupling end and the isolation end, and is directed to the coupling end. Refer to the coupler shown in FIG. 2. When a signal current is input from the signal input end to the main signal path, the signal current is output from the signal output end through the main signal path. The isolation end of the coupling signal path is connected to a ground end GND. In this way, a coupled current opposite to the main signal path is generated on the coupling signal path according to the left-hand rule (induced current), and is output from the coupling end.

The coupler provided in embodiments of this application may be used in an electronic device. The electronic device is different types of terminals such as a mobile phone, a tablet computer, a personal computer (PC), a personal digital assistant (PDA), a smartwatch, a netbook, a wearable electronic device, an augmented reality (AR) device, a virtual reality (VR) device, an in-vehicle device, a smart car, a smart speaker, a robot, and smart glasses. The electronic device may alternatively be a network device such as a base station. A specific form of the electronic device is not specifically limited in this embodiment of this application.

Figure 3:
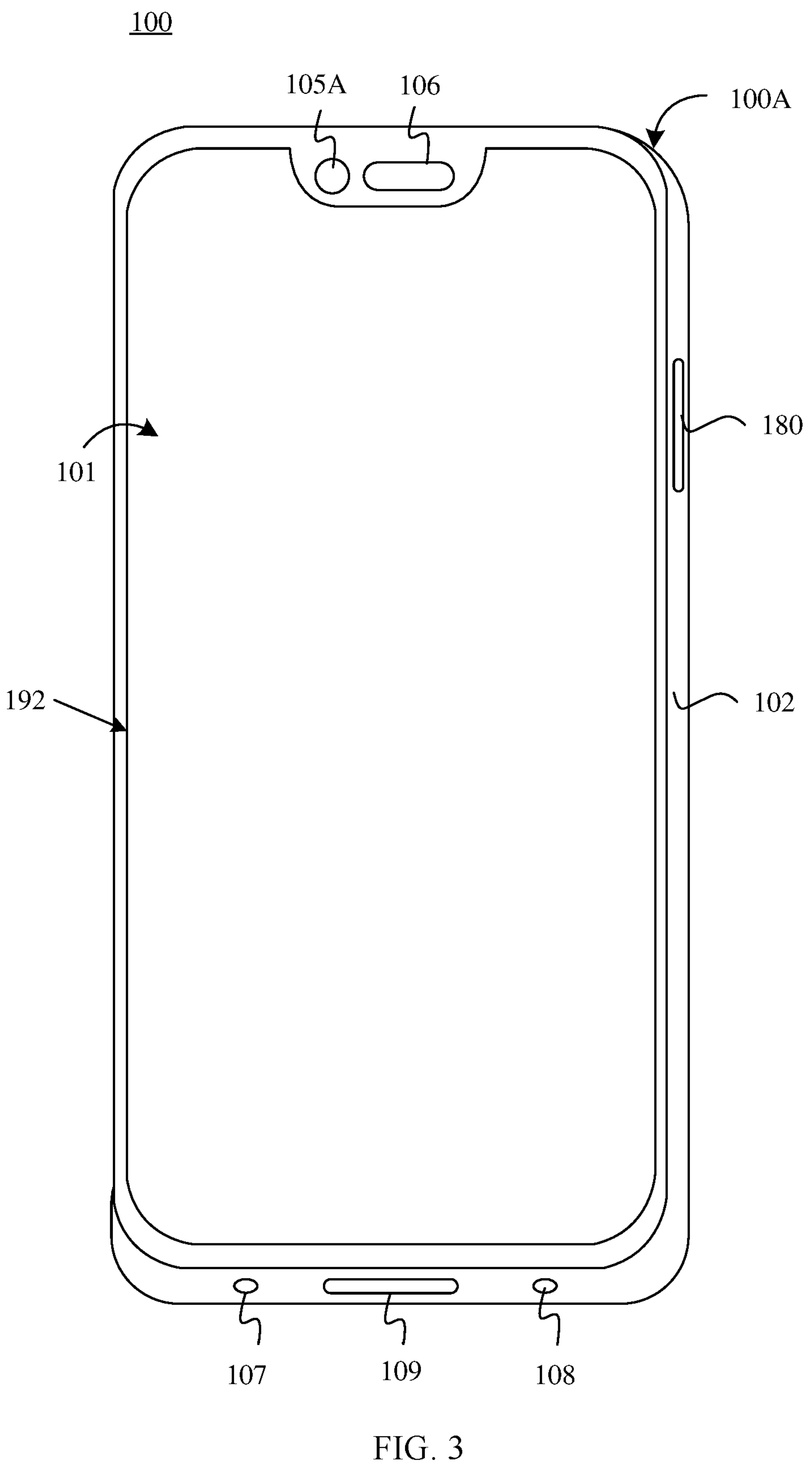
FIG. 3 is a schematic diagram of a structure of an electronic device according to an embodiment of this application.
Figure 4:
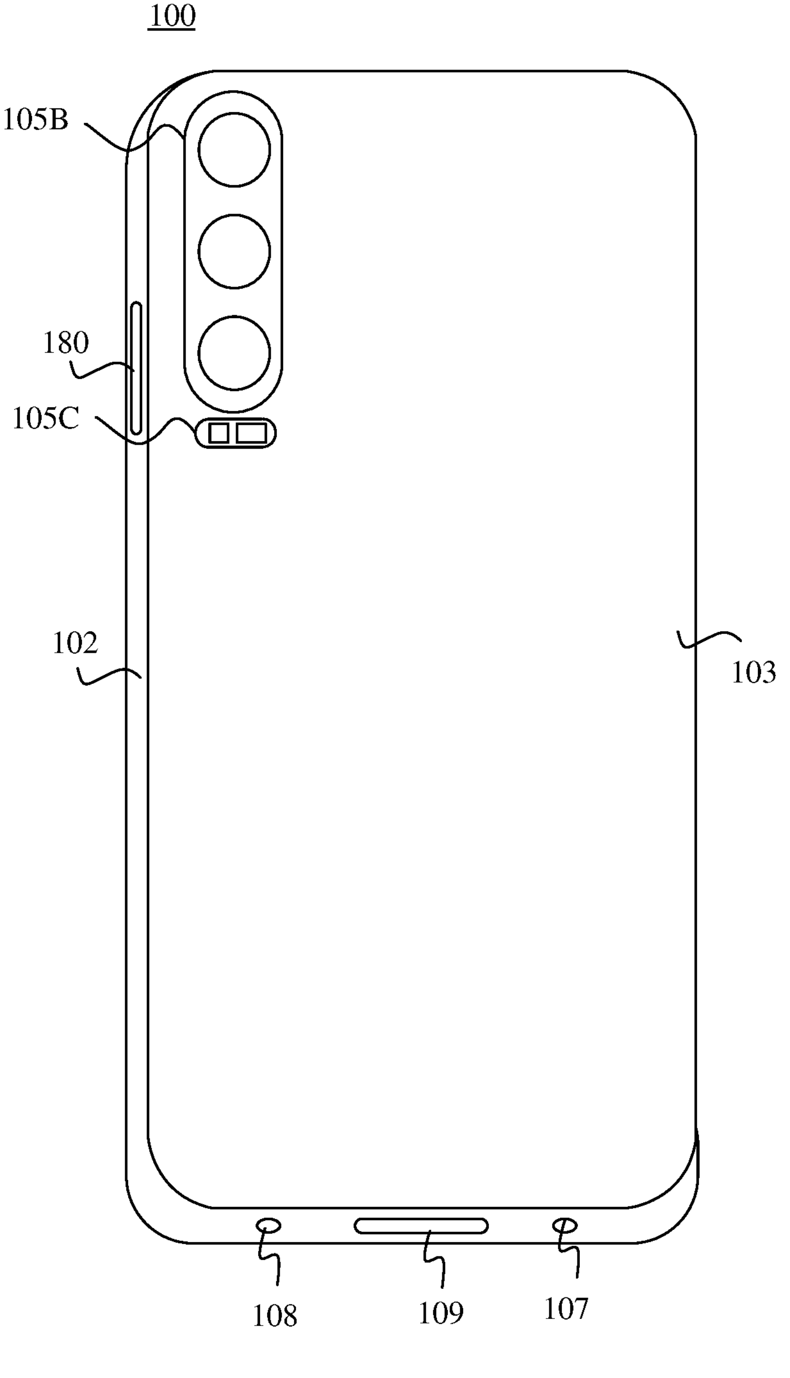
FIG. 4 is a schematic diagram of a structure of an electronic device according to another embodiment of this application.
Figure 5:
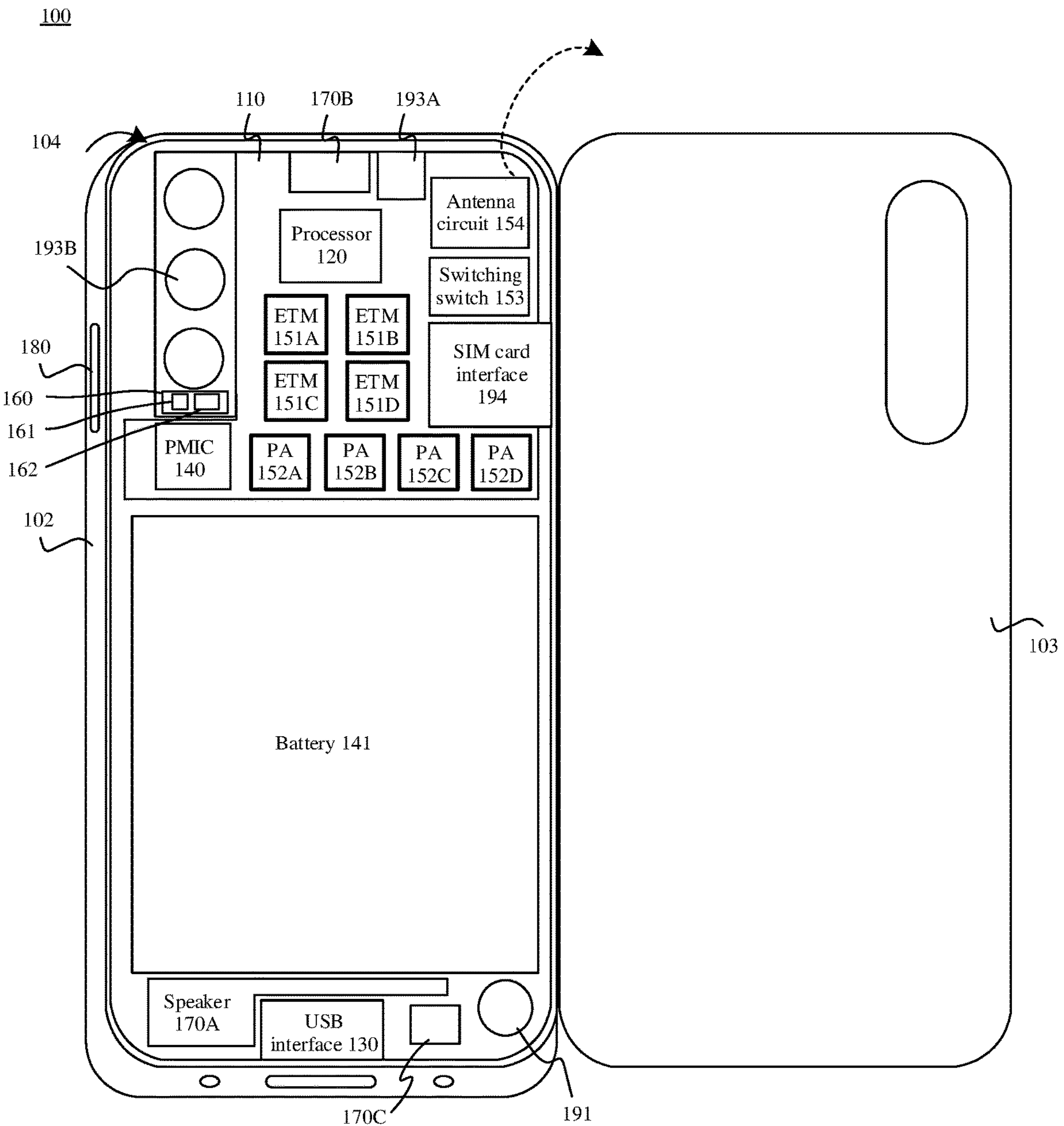
FIG. 5 is a schematic diagram of a structure of an electronic device according to still another embodiment of this application.

A mobile phone is used as an example. FIG. 3 to FIG. 5 are schematic diagrams of structures of an electronic device 100. FIG. 3 is a top view of the electronic device 100 according to the described embodiment. FIG. 4 is a bottom view of the electronic device 100 according to the described embodiment. A top view where a rear cover of the electronic device 100 is opened is shown in FIG. 5. The top view shows a specific configuration of internal components according to the described embodiment. A dashed arrow in FIG. 5 indicates a direction in which the rear cover is opened. It may be understood that a structure shown in this embodiment does not constitute a specific limitation on the electronic device 100. In some other embodiments of this application, the electronic device 100 may include more or fewer components than those shown in the figure, or some components may be combined, or some components may be split, or different component arrangements may be used.

As shown in FIG. 3 and FIG. 4, the electronic device 100 may include a housing 100A. The housing 100A may include a front cover 101, a rear cover 103, and a frame 102. The front cover 101 and the rear cover 103 are disposed opposite to each other. The frame 102 surrounds the front cover 101 and the rear cover 103, and connects the front cover 101 and the rear cover 103. The front cover 101 may be a glass cover, and a display 192 is disposed below the front cover 101. The electronic device 100 may be provided with an input/output component peripherally around the housing 100A. For example, a via 105A of a front-facing camera and a via 106 of a receiver may be disposed on the top of the front cover 101. A key 180 may be disposed on an edge of the frame 102, and a hole 107 of a microphone, a hole 108 of a speaker, and a hole 109 of a USB interface may be disposed on a bottom edge of the frame 102. A hole 105B of a rear-facing camera and a hole 105C of a PPG sensor may be disposed on the top of the rear cover 103.

The housing 100A may have a cavity 104 inside, and an internal component is packaged in the cavity. As shown in FIG. 5, an internal component may be accommodated in the cavity 104, and the internal component may include components such as a printed circuit board (PCB) 110, a speaker 170A configured to convert an audio electrical signal into a sound signal, a receiver 170B configured to convert an audio electrical signal into a sound signal, a microphone 170C configured to convert a sound signal into an electrical signal, a USB interface 130, a front-facing camera 193A, a rear-facing camera 193B, and a motor 191 configured to generate a vibration prompt. A printed circuit board 110 may be disposed with components, such as a processor 120, a power management integrated circuit (PMIC) 140, and at least one power amplifier (where in an embodiment, a power amplifier (PA) 152A, a power amplifier PA 152B, a power amplifier PA 152C and a power amplifier PA 152D are included, where different power amplifiers PAs support different frequency bands and are configured to amplify transmit signals of the different frequency bands, for example, the power amplifier PA 152A and the power amplifier PA 152B may be configured to amplify a transmit signal within a first bandwidth range, and a power amplifier PA 152C and a power amplifier PA 152D may be configured to amplify a transmit signal within a second bandwidth range), at least one envelope tracking modulator (ETM) configured to supply power to the power amplifier (where in an embodiment, an envelope tracking modulator ETM 151A and an envelope tracking modulator ETM 151B are included, where different envelope tracking modulators ETM support different bandwidths, for example, the envelope tracking modulator ETM 151A supplies power to the power amplifier PA 152A and the power amplifier PA 152B, and the envelope tracking modulator ETM 151B supplies power to the power amplifier PA 152C and the power amplifier PA 152D), a switching switch 153, and an antenna circuit 154. A PPG sensor 160 includes a detector 161 and a light emitting device driving circuit 162, where the detector 161 is configured to detect a test optical signal of a light emitting device of the light emitting device driving circuit 162 reflected and/or scattered by a detected object. In addition, the printed circuit board 110 may further include components such as a coupler, a filter, a low noise amplifier, an audio codec, an internal memory, a sensor, an inductor, and a capacitor. To clearly display this embodiment, the filter, the low noise amplifier, the audio codec, the internal memory, the sensor, the inductor, and the capacitor are not shown in FIG. 5. Components on the printed circuit board 110 are closely arranged, so that all components are placed in limited space. A manner of arranging the components on the printed circuit board 110 is not limited. In some embodiments, the components on the printed circuit board 110 may be disposed on a side of the printed circuit board 110 (for example, a side facing the rear cover 1023). In some embodiments, the components on the printed circuit board 110 may be disposed on two sides of the printed circuit board 110 (for example, on the side facing the rear cover 1023, and on a side facing the front cover 101).

The processor 120 may include one or more processing units. For example, the processor 120 may include an application processor (AP), a modem processor, a graphics processing unit (GPU), an image signal processor (ISP), a neural-network processing unit (NPU), a controller, a video codec, a digital signal processor (DSP), a baseband, and/or a radio frequency circuit. The controller may generate an operation control signal based on an instruction operation code and a time sequence signal, to complete control of instruction reading and instruction execution.

A memory may be disposed in the processor 120, and is configured to store instructions and data. In some embodiments, the memory in the processor 120 includes a cache. The memory may store instructions or data just used or cyclically used by the processor 120. If the processor 120 needs to use the instructions or the data again, the instructions or the data may be directly invoked from the memory. This reduces repeated access and reduces waiting time of the processor 120, thereby improving system efficiency.

The processor 120 may perform frequency modulation on a signal based on a mobile communication technology or a wireless communication technology. The mobile communication technology may include a global system for mobile communications (GSM), a general packet radio service (GPRS), code division multiple access (CDMA), wideband code division multiple access (WCDMA), time-division code division multiple access (TD-CDMA), long term evolution (LTE), an emerging wireless communication technology (which may also be referred to as a 5th generation mobile communication technology, 5th-Generation, or 5th-Generation New Radio, and is briefly referred to as 5G, a 5G technology, or 5G NR), and the like. The wireless communication technology may include a wireless local area network (WLAN) (for example, a wireless fidelity (Wi-Fi) network), Bluetooth (BT), a global navigation satellite system (GNSS), frequency modulation (FM), a near field communication (NFC) technology, an infrared (IR) technology, and the like.

The processor 120 may further include at least one baseband and at least one radio frequency circuit. The baseband is configured to synthesize a to-be-transmitted baseband signal or/and decode a received baseband signal. Specifically, during transmission, the baseband encodes a voice signal or another data signal into a baseband signal (baseband code) for transmission; and during receiving, the baseband decodes a received baseband signal (baseband code) into a voice signal or another data signal. The baseband may include components such as an encoder, a decoder, and a baseband processor. The encoder is configured to synthesize a baseband signal to be transmitted, and the decoder is configured to decode a received baseband signal. The baseband processor may be a microprocessor (MCU). The baseband processor may be configured to control the encoder and the decoder. For example, the baseband processor may be configured to complete scheduling of encoding and decoding, communication between the encoder and the decoder, and peripheral driving (which may enable a component other than the baseband by sending an enable signal to the component other than the baseband), and the like. The radio frequency circuit is configured to: process a baseband signal to form a transmit (TX) signal, and transfer the transmit signal to the power amplifier PA for amplification; and/or the radio frequency circuit is configured to: process a receive (RX) signal to form a baseband signal, and send the formed baseband signal to the baseband for decoding. In some embodiments, each baseband corresponds to one radio frequency circuit, to perform frequency modulation on the signal based on one or more communication technologies. For example, a first baseband and a first radio frequency circuit perform frequency modulation on the signal based on the 5G technology, a second baseband and a second radio frequency circuit perform frequency modulation on the signal based on a 4G technology, a third baseband and a third radio frequency circuit perform frequency modulation on the signal based on a Wi-Fi technology, and a fourth baseband and a fourth radio frequency circuit perform frequency modulation on the signal based on a Bluetooth technology, and the like. Alternatively, the first baseband and the first radio frequency circuit may perform frequency modulation on the signal based on both the 4G technology and the 5G technology, and the second baseband and the second radio frequency circuit perform frequency modulation on the signal based on the Wi-Fi technology, and the like. In some embodiments, one baseband may alternatively correspond to a plurality of radio frequency circuits, to improve integration.

In some embodiments, the baseband, the radio frequency circuit and another component of the processor 120 may be integrated into an integrated circuit. In some embodiments, the baseband and the radio frequency circuit each may be an independent component independent of the processor 120. In some embodiments, one baseband and one radio frequency circuit may be integrated into a component independent of the processor 120.

In the processor 120, different processing units may be independent components, or may be integrated into one or more integrated circuits.

The antenna circuit 154 is configured to transmit and receive an electromagnetic wave signal (a radio frequency signal). The antenna circuit 154 may include a plurality of antennas or a plurality of groups of antennas (a group of antennas include more than two antennas), and each antenna or the plurality of groups of antennas may be configured to cover one or more communication bands. The plurality of antennas each may be one or more of a multi-frequency antenna, an array antenna, or an on-chip antenna.

The processor 120 is coupled to the antenna circuit 154, to implement a plurality of functions associated with transmitting and receiving the radio frequency signal. For example, when the electronic device 100 transmits a signal, the baseband synthesizes to-be-transmitted data (a digital signal) into a to-be-transmitted baseband signal, the radio frequency circuit convert the baseband signal into a transmit signal (a radio frequency signal) the power amplifier amplifies the transmit signal, and the amplified output signal that is output by the power amplifier is transferred to the switching switch 153 and then is transmitted by the antenna circuit 154. A path for sending the transmit signal by the processor 120 to the switching switch 153 is a transmit link (or referred to as a transmit path). When the electronic device 100 needs to receive a signal, the antenna circuit 154 sends a received signal (a radio frequency signal) to the switching switch 153, the switching switch 153 sends a radio frequency signal to the radio frequency circuit, the radio frequency circuit processes the radio frequency signal to obtain a baseband signal, and the radio frequency circuit converts the processed baseband signal into data and then sends the data to a corresponding application processor. A path for sending the radio frequency signal by the switching switch 153 to the processor 120 is a receiving link (or referred to as a receiving path).

The switching switch 153 may be configured to selectively connect the antenna circuit 154 electrically to the transmit link or the receive link. In some embodiments, the switching switch 153 may include a plurality of switches. The switching switch 153 may be further configured to provide additional functions, including signal filtering and/or duplexing.

The SIM card interface 194 is configured to connect to a SIM card. The SIM card may be inserted into the SIM card interface 194 or removed from the SIM card interface 194, to implement contact with or separation from the electronic device 100. The electronic device 100 may support one or N SIM card interfaces, where N is a positive integer greater than 1. The SIM card interface 194 may support a nano-SIM card, a micro-SIM card, a SIM card, and the like. A plurality of cards may be inserted into a same SIM card interface 194 at the same time. The plurality of cards may be of a same type or different types. Each SIM card may support one or more communication standards, and each communication standard has a specified frequency band and specifies different maximum bandwidths. The SIM card interface 194 may be compatible with different types of SIM cards. The SIM card interface 194 is also compatible with an external storage card. The electronic device 100 interacts with a network through the SIM card, to implement functions such as conversation and data communication. In some embodiments, the electronic device 100 uses an eSIM, that is, an embedded SIM card. The eSIM card may be embedded into the electronic device 100, and cannot be separated from the electronic device 100.

A PMIC 140 is configured to manage power in the electronic device 100. For example, the PMIC 140 may include a charging management circuit and a power supply management circuit. The charging management circuit is configured to receive a charging input from a charger. For example, in some embodiments of wired charging, the charging management circuit may receive a charging input of a wired charger through a USB interface 130. The power supply management circuit is configured to receive input of a battery 141 and/or the charging management circuit, and supply power to components such as the processor 120, the display 192, the front-facing camera 193A, the rear-facing camera 193B, and the motor 191. In some other embodiments, the charging management circuit and the power supply management circuit may alternatively be disposed in the processor 120. In some other embodiments, the charging management circuit and the power supply management circuit may alternatively be disposed in different components.

With reference to the foregoing electronic device, a signal input end of the coupler provided in this embodiment of this application is coupled to an output end of a radio frequency amplifier, and a signal output end of the coupler is coupled to an input end of a duplexer. In this way, a signal output by the coupling end of the coupler may be used for digital predistortion (DPD) or analog predistortion (APD) calibration. The duplexer may specifically be a filter. Alternatively, the signal input end of the coupler is coupled to an output end of the duplexer, and the signal output end of the coupler is coupled to an antenna. In this way, a signal output by the coupling end of the coupler may be used for antenna standing wave detection. In addition, the signal output by the coupling end of the coupler may also be used by a calibration circuit of an active antenna system (AAS) to detect power and a phase of a transceiver (TRX) channel. In some examples, a circulator is further coupled between the signal input end of the coupler and the output end of the radio frequency amplifier. A phase shifter (for example, a phase shifter used for hybrid beamforming (HBF)) is further coupled between the signal output end of the coupler and the antenna.

Figure 6A:
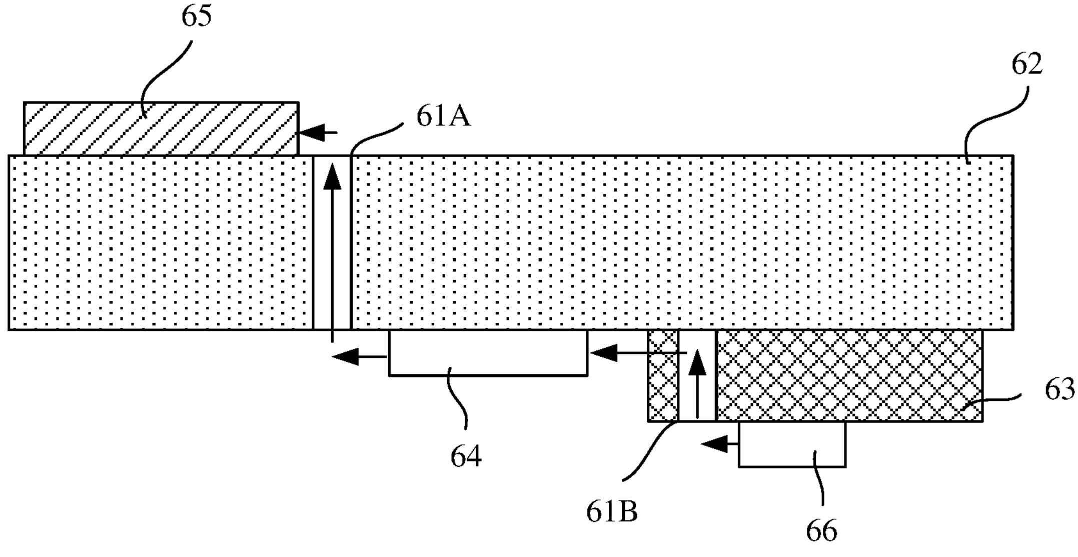
FIG. 6A is a schematic diagram of a structure of a radio frequency circuit board according to an embodiment of this application.

Specifically, in terms of structure, the coupler may be disposed on a radio frequency circuit board. Refer to FIG. 6A. The radio frequency circuit board includes a printed circuit board PCB 62 and a coupler 61 (61A) disposed on the PCB 62. A signal input end of the coupler 61A is coupled to an output end of a duplexer 64, and a signal output end of the coupler 61A is coupled to an antenna 65. Alternatively, refer to FIG. 6B. The signal input end of the coupler 61A is coupled to an output end of a radio frequency amplifier 63, and the signal output end of the coupler 61A is coupled to an input end of the duplexer 64. For example, in FIG. 6A and FIG. 6B, a circulator 66 is further coupled to the output end of the radio frequency amplifier 63. The circulator 66 has a unidirectional transmission function, and can ensure that a signal output by the radio frequency amplifier 63 is unidirectionally output to a next component. In some examples, refer to FIG. 6C. The signal input end of the coupler 61 (61A) may be further coupled to an antenna (not shown in FIG. 6C) through a phase shifter 67 (for example, a phase shifter that may be used for HBF).

Figure 6B:
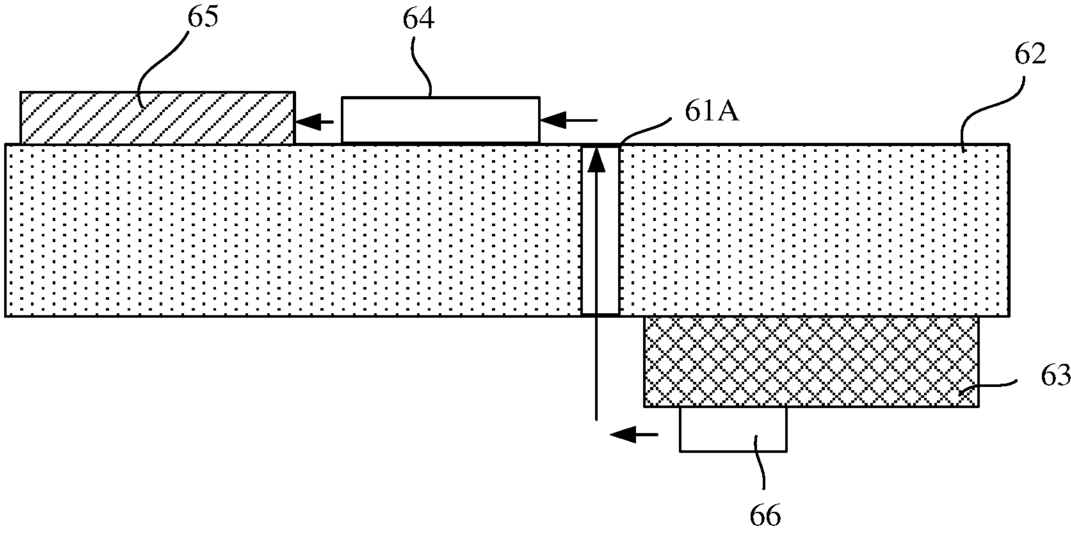
FIG. 6B is a schematic diagram of a structure of a radio frequency circuit board according to another embodiment of this application.
Figure 6C:
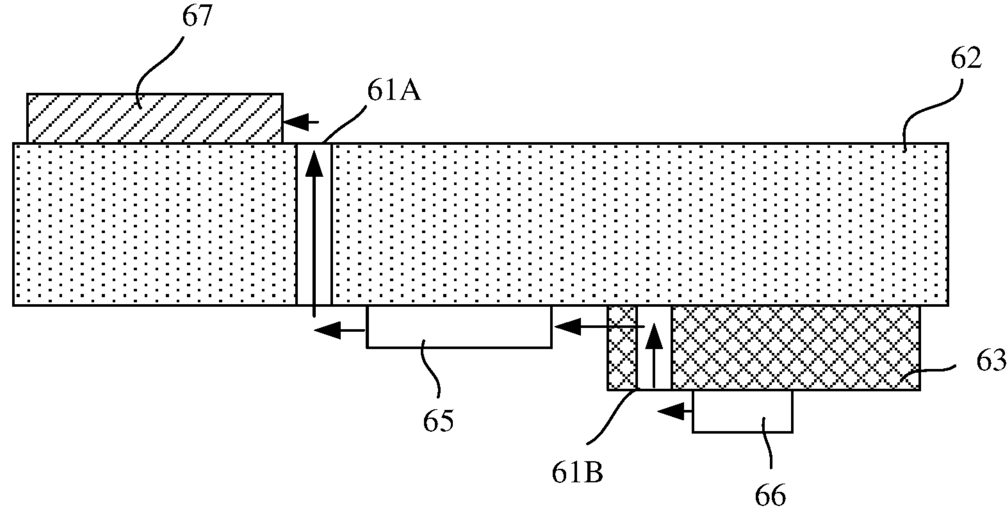
FIG. 6C is a schematic diagram of a structure of a radio frequency circuit board according to still another embodiment of this application.

In addition, in some examples, refer to FIG. 6A and FIG. 6C. The coupler 61 (61B) may be disposed on the radio frequency amplifier 63. The radio frequency amplifier 63 includes a printed circuit board PCB (not shown in the figure), a power amplifying transistor disposed on the PCB, and the coupler 61B, where a signal input end of the coupler 61B is coupled to an output end of the power amplifying transistor. In addition, as shown in FIG. 6C, when a circulator 66 is further coupled to the output end of the radio frequency amplifier 63, the signal input end of the coupler 61B is coupled to an output end of the circulator 66.

Figure 7:
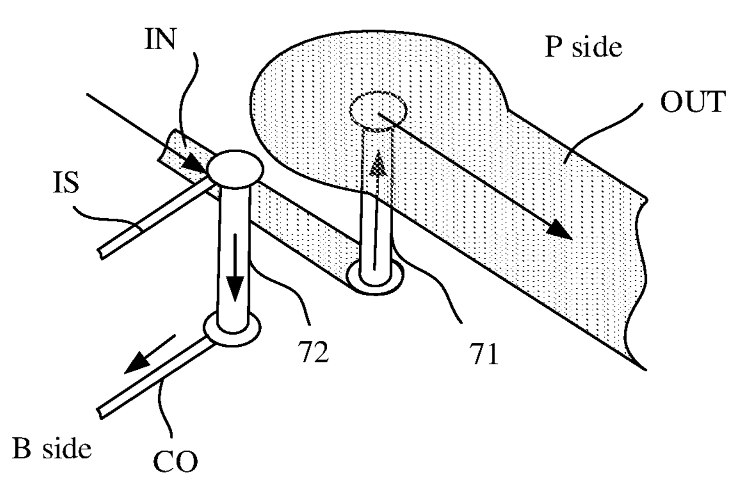
FIG. 7 is a schematic diagram of a structure of a coupler according to another embodiment of this application.

Refer to FIG. 7. An embodiment of this application provides a coupler. The coupler includes a signal input end IN, a signal output end OUT, a coupling end CO (couple), and an isolation end IS (isolate). The coupler is configured to couple a signal transmitted on a path between the signal input end IN and the signal output end OUT to a path between the coupling end CO and the isolation end IS. The coupler further includes a main signal hole 71 disposed on a printed circuit board PCB (not shown in FIG. 7) and a first coupling hole 72 disposed on the PCB. A first end of the main signal hole 71 is coupled to the signal input end IN, a second end of the main signal hole 71 is coupled to the signal output end OUT, a first end of the first coupling hole 72 is coupled to the coupling end CO, and a second end of the first coupling hole 72 is coupled to the isolation end IS. In a thickness direction of the PCB, the first end of the first coupling hole 72 and the first end of the main signal hole 71 are close to a first side of the PCB (which may be, for example, a B side of the PCB), and the second end of the first coupling hole 72 and the second end of the main signal hole 71 are close to a second side of the PCB (for example, a P side of the PCB).

The main signal hole 71 is used as a main signal path of the coupler, and the first coupling hole 72 is used as a coupling signal path of the coupler. When a signal current is input from the signal input end IN to the main signal hole 71, the signal current is output from the signal output end OUT through the main signal hole 71. An isolation end IS of the first coupling hole 72 is connected to a ground end. In this way, the first coupling hole 72 generates a coupling current opposite to the first coupling hole 72 according to the left-hand rule (induced current), and outputs the coupling current from the coupling end CO, to implement a function of the coupler. It should be noted that, in this embodiment of this application, the main signal hole 71 and the first coupling hole 72 are not limited to any form of a plating through hole, a buried via hole, or a blind via hole shown in FIG. 1. The main signal hole 71 shown in FIG. 7 may be a plating through hole, and the first coupling hole 72 may be a plating through hole. Certainly, it may be understood that, a larger length of the main signal hole 71 and the first coupling hole 72 that overlap in an extension direction indicates a higher coupling degree of the coupler. For example, when the main signal hole 71 and the first coupling hole 72 use plating through holes of a same length, a higher coupling degree may be obtained. Certainly, based on an actual requirement, when the first coupling hole 72 is a blind via hole or a buried via hole shorter than the plating through hole of the main signal hole 71, the coupling degree of the coupler may also be reduced.

In addition, refer to FIG. 6A, FIG. 6B, and FIG. 6C. Because the main signal hole of the coupler 61A is coupled between the output end of the duplexer 64 and the antenna 65, or the main signal hole of the coupler 61A is coupled between the output end of the radio frequency amplifier 63 and the input end of the duplexer 64, as shown in FIG. 6A or FIG. 6C, the duplexer 64 and the antenna 65 are respectively located on the two sides of the PCB. Alternatively, as shown in FIG. 6B, the duplexer 64 and the radio frequency amplifier 63 are separately disposed on the two sides of the PCB.

In this embodiment of this application, because both the main signal path and the coupling signal path of the coupler are implemented in a form of a via on the PCB, and vias on the PCB are usually distributed along the thickness direction of the PCB, compared with a coupler that is currently implemented by using strip-shaped wiring disposed on a PCB plane, the coupler provided in this embodiment of this application occupies a smaller PCB layout area. This is more conducive to the requirement for miniaturization of the device. In addition, because both the main signal hole and the first coupling hole are vias on the PCB, media around the main signal hole and the first coupling hole are evenly distributed. Therefore, a signal has a same odd-even mode propagation speed in the main signal hole or the first coupling hole, and better directivity can be obtained.

Figure 8:
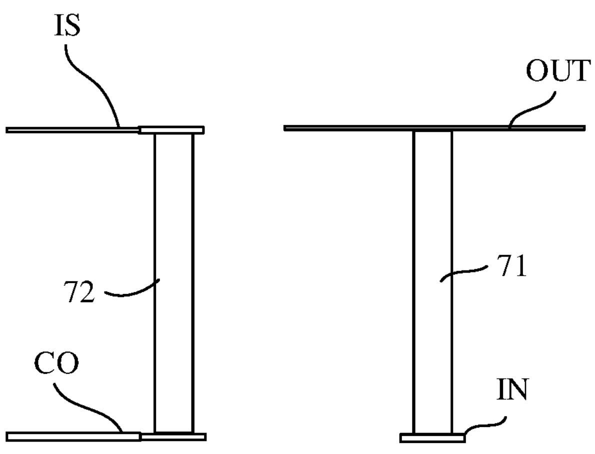
FIG. 8 is a schematic diagram of a side view structure of the coupler shown in FIG. 7 according to an embodiment of this application.
Figure 9:
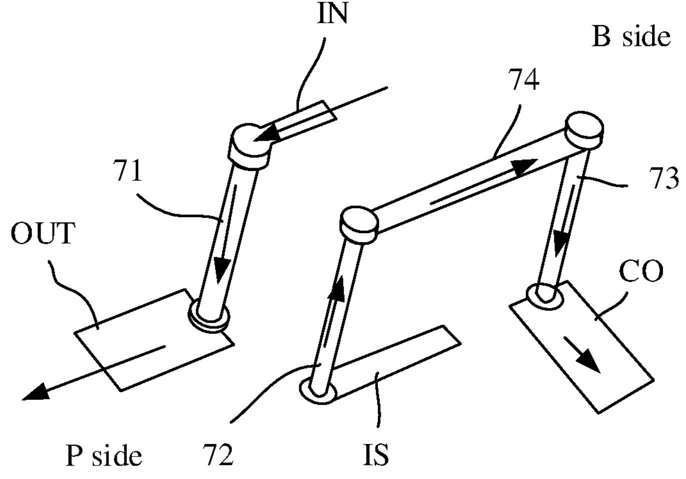
FIG. 9 is a schematic diagram of a structure of a coupler according to still another embodiment of this application.

In addition, FIG. 8 is a schematic diagram of a structure of a side view of the coupler in FIG. 7, where the coupling end CO and the isolation end IS are respectively located at two ends of the first coupling hole. In this way, when the component connected to the coupling end CO and the ground end are both located on a same side of the PCB, for ease of connection, as shown in FIG. 9, the coupler further includes a layer change hole 73 disposed on the PCB, where a first end of the layer change hole 73 is coupled to the first end of the first coupling hole 72 through a first line 74 of the first layer in the PCB, and a second end of the layer change hole 73 is coupled to the coupling end CO. In this way, the coupling end CO and the isolation end IS may be led out on the same side of the PCB, to facilitate connection with another component. In a thickness direction of the PCB, the first end of the layer change hole 73 is close to the first side (for example, the B side) of the PCB, and the second end of the layer change hole 73 is close to the second side (for example, the P side) of the PCB.

Figure 10:
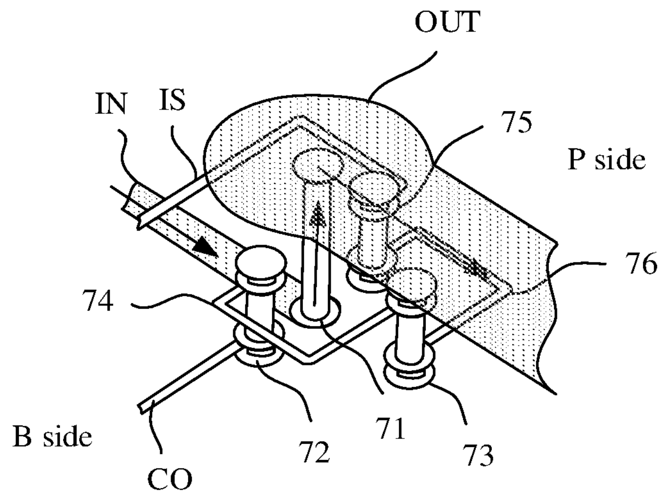
FIG. 10 is a schematic diagram of a structure of a coupler according to yet another embodiment of this application.
Figure 11:
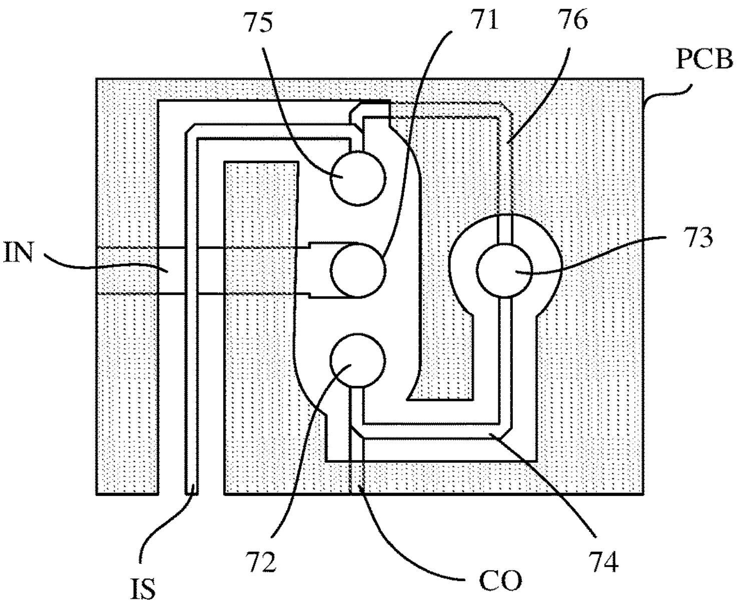
FIG. 11 is a schematic diagram of a top view structure of the coupler shown in FIG. 10 according to an embodiment of this application.

In some examples, to improve a coupling degree between the main signal path and the coupling signal path of the coupler, a plurality of coupling holes may be disposed. The plurality of coupling holes are connected in series by using the layer change hole. Refer to FIG. 10 and a top view FIG. 11 of the structure in FIG. 10 (the signal output end OUT is not shown in FIG. 11). The coupler further includes: a second coupling hole 75 and a layer change hole 73 that are disposed on the PCB, where the layer change hole 73 is connected in series between the first coupling hole 72 and the second coupling hole 75. A first end of the layer change hole 73 is coupled to a second end of the first coupling hole 72 through a first line 74 of a first layer in the PCB, a second end of the layer change hole 73 is coupled to a first end of the second coupling hole 75 through a second line 76 of a second layer in the PCB, and a second end of the second coupling hole 75 is coupled to the isolation end IS. In a thickness direction of the PCB, the first end of the second coupling hole 75 and the second end of the layer change hole 73 are close to the first side (for example, the B side) of the PCB, and the second end of the second coupling hole 75 and the first end of the layer change hole 73 are close to the second side (for example, the P side) of the PCB.

Figure 12:
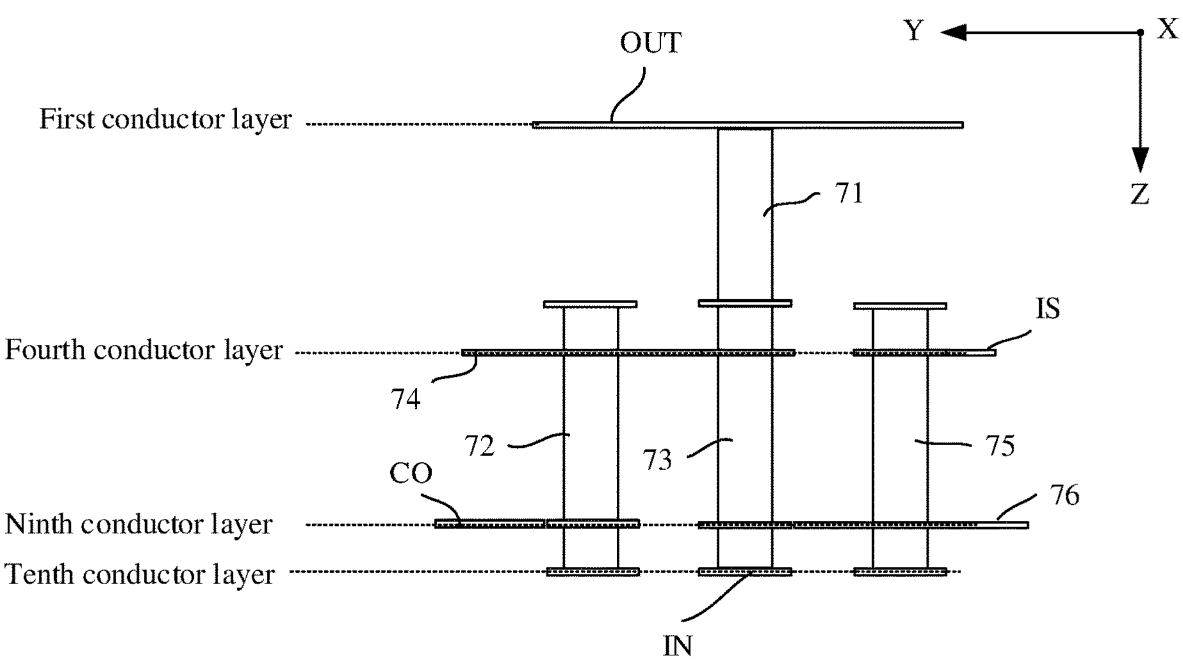
FIG. 12 is a schematic diagram of a side view structure of the coupler shown in FIG. 10 according to an embodiment of this application.
Figure 13:
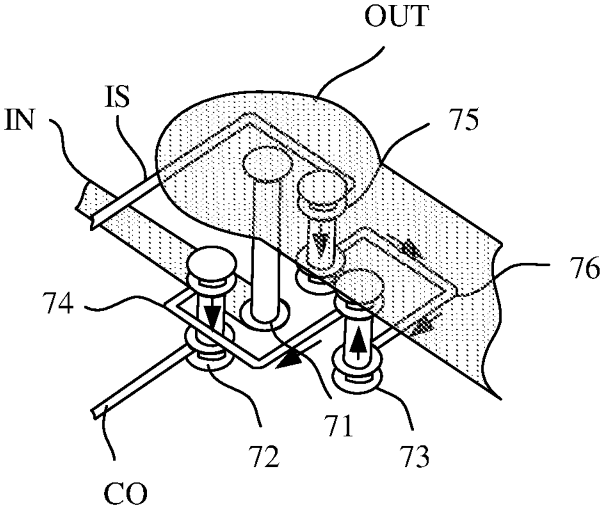
FIG. 13 is a schematic diagram of a structure of a coupler according to still yet another embodiment of this application.

Refer to the side view FIG. 12 of the structure shown in FIG. 10. A PCB including 10 conductor layers is used as an example. The signal output end OUT is located at the first conductor layer. The first line 74 and the isolation end IS are located at a fourth conductor layer. The second line 76 and the coupling end CO are located at a ninth conductor layer. The input terminal IN is located at a tenth conductor layer. To implement even distribution of lines at each conductor layer, the lines provided in FIG. 12 are all exemplary. In some examples, the second line 76 and the coupling end CO may also be disposed at the tenth conductor layer. Alternatively, when the first coupling hole 72, the second coupling hole 75, and the layer change hole 73 are plating through holes, the first line 74 and the isolation end IS may also be disposed at any one of the first conductor layer to the ninth conductor layer. However, the conductor layers disposed on the first line 74, the isolation end IS, the second line 76, and the coupling end CO determine an effective coupling length of the first coupling hole 72 and the second coupling hole 75. For example, an effective coupling length of the first coupling hole 72 is mainly a part between the first line 74 and the coupling end CO, and an effective coupling length of the second coupling hole 75 is mainly a part between the second line 76 and the isolation end SI. Therefore, the first line 74, the isolation end IS, the second line 76, and the conductor layer where the coupling end CO is located need to be set based on a strength of an actually required coupling signal. To ensure the coupling degree of the coupler, extension directions of the main signal hole and the first coupling hole are parallel to the thickness direction (a Z direction in FIG. 12) of the PCB. In this way, when the first coupling hole is parallel to the main signal hole, the first coupling hole can effectively couple most energy in the main signal hole. Similarly, an extension direction of the second coupling hole is parallel to the thickness direction of the PCB, and an extension direction of the layer change hole is parallel to the thickness direction of the PCB. In addition, as shown in FIG. 10, when the main signal hole 71 is used as the main signal path of the coupler, and a signal current is input from the signal input end IN to the main signal hole 71, the signal current is output from the signal output end OUT through the main signal hole 71 (as shown by a solid line arrow in FIG. 10). As shown in FIG. 13, a flow direction of a coupling current generated by the first coupling hole 72, the first line 74, the layer change hole 73, the second line 76, and the second coupling hole 75 on a coupling signal path formed between the coupling end CO and the isolation end IS is shown by a solid line arrow in FIG. 13. A coupling current I1 is generated on the second coupling hole 75. The current I1 is transmitted from the second coupling hole 75 to the layer change hole 73 through the second line 76, and is transmitted to the first coupling hole 72 through the first line 74 after layer change through the layer change hole 73. The current I1 is superposed on a current I2 coupled through the first coupling hole 72 to form a current Ia11, and the current Ia11 is output from the coupling end CO after being transmitted through the second coupling hole. It should be noted that a phase change occurs when the current I1 flows through the first line 74, the layer change hole 73, and the second line 76. To avoid direct cancellation between the current I1 and the current I2, a phase difference between signals in the first coupling hole 72 and the second coupling hole 73 is less than 180°. That is, a phase shift generated when a signal on the second coupling hole 75 passes through the second line 76, the layer change hole 73, and the first line 74 is less than 180°.

In addition, to prevent a signal coupled through the layer change hole 73 from directly canceling a signal on the coupling signal path, to reduce the coupling degree of the coupler, a distance between the layer change hole 73 and the main signal hole may be extended as far as possible. For example, the distance between the layer change hole 73 and the main signal hole 71 is greater than a distance between the first coupling hole 72 and the main signal hole 71. Alternatively, the distance between the layer change hole 73 and the main signal hole 71 is greater than a distance between the second coupling hole 75 and the main signal hole 71. In addition, to improve the coupling degree of the coupler, a distance between the first coupling hole 72 and the main signal hole 71 and a distance between the second coupling hole 75 and the main signal hole 71 may be as short as possible. For example, the distance between the first coupling hole and the main signal hole is less than a first threshold. The distance between the second coupling hole and the main signal hole is less than a first threshold.

In another example, to prevent a signal coupled through the layer change hole 73 from directly canceling a signal on the coupling signal path, to reduce the coupling degree of the coupler, a reference ground may be disposed between the layer change hole 73 and the main signal hole 71, a reference ground may be disposed between the layer change hole 73 and the first coupling hole 72, and a reference ground may be disposed between the layer change hole 73 and the second coupling hole 75. The layer change hole 73 is isolated from other vias by using a reference ground, to prevent a signal on the other vias from being directly coupled to the layer change hole 73.

In the foregoing embodiments, the description of each embodiment has respective focuses. For a part that is not described in detail in an embodiment, refer to related descriptions in other embodiments.

Although this application is described with reference to specific features and embodiments thereof, it is clear that various modifications and combinations may be made to them without departing from the spirit and scope of this application. Correspondingly, the specification and accompanying drawings are merely example description of this application defined by the accompanying claims, and are considered as any of or all modifications, variations, combinations or equivalents that cover the scope of this application. It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A coupler for wireless communication, comprising:

a signal input end;

a signal output end;

a coupling end; and an isolation end, a main signal hole disposed on a printed circuit board (PCB) and a first coupling hole disposed on the PCB; and wherein the coupler is configured to couple a signal transmitted on a path between the signal input end and the signal output end to a path between the coupling end and the isolation end, a first end of the main signal hole is coupled to the signal input end, a second end of the main signal hole is coupled to the signal output end, a first end of the first coupling hole is coupled to the coupling end, a second end of the first coupling hole is coupled to the isolation end, and in a thickness direction of the PCB, the first end of the first coupling hole and the first end of the main signal hole are close to a first side of the PCB, and the second end of the first coupling hole and the second end of the main signal hole are close to a second side of the PCB.

2. The coupler according to claim 1, further comprising:

a second coupling hole and a layer change hole disposed on the PCB, wherein the layer change hole is connected in series between the first coupling hole and the second coupling hole, a first end of the layer change hole is coupled to the second end of the first coupling hole through a first line of a first layer in the PCB, a second end of the layer change hole is coupled to a first end of the second coupling hole through a second line of a second layer in the PCB, a second end of the second coupling hole is coupled to the isolation end, and in the thickness direction of the PCB, the first end of the second coupling hole and the second end of the layer change hole are close to the first side of the PCB, and the second end of the second coupling hole and the first end of the layer change hole are close to the second side of the PCB.

3. The coupler according to claim 1, further comprising:

a layer change hole disposed on the PCB, wherein a first end of the layer change hole is coupled to the first end of the first coupling hole through a first line of a first layer in the PCB, a second end of the layer change hole is coupled to the coupling end, and in the thickness direction of the PCB, the first end of the layer change hole is close to the first side of the PCB, and the second end of the layer change hole is close to the second side of the PCB.

4. The coupler according to claim 1, wherein a distance between the first coupling hole and the main signal hole is less than a first threshold.

5. The coupler according to claim 2, wherein a distance between the second coupling hole and the main signal hole is less than a first threshold.

6. The coupler according to claim 2, wherein a distance between the layer change hole and the main signal hole is greater than a distance between the first coupling hole and the main signal hole.

7. The coupler according to claim 2, wherein a distance between the layer change hole and the main signal hole is greater than a distance between the second coupling hole and the main signal hole.

8. The coupler according to claim 2, wherein a reference ground is disposed between the layer change hole and the main signal hole.

9. The coupler according to claim 2, wherein a reference ground is disposed between the layer change hole and the first coupling hole.

10. A radio frequency circuit board comprising:

a printed circuit board (PCB); and a coupler disposed on the PCB, wherein the coupler comprises:

a signal input end;

a signal output end[ a coupling end;

an isolation end;

a main signal hole disposed on the printed circuit board PCB; and a first coupling hole disposed on the PCB, wherein the coupler is configured to couple a signal transmitted on a path between the signal input end and the signal output end to a path between the coupling end and the isolation end, a first end of the main signal hole is coupled to the signal input end, a second end of the main signal hole is coupled to the signal output end, a first end of the first coupling hole is coupled to the coupling end, a second end of the first coupling hole is coupled to the isolation end, and in a thickness direction of the PCB, the first end of the first coupling hole and the first end of the main signal hole are close to a first side of the PCB, and the second end of the first coupling hole and the second end of the main signal hole are close to a second side of the PCB, and wherein the signal input end of the coupler is for coupling to an output end of a radio frequency amplifier and the signal output end of the coupler is for coupling to an input end of a duplexer, or the signal input end of the coupler is for coupling to an output end of the duplexer and the signal output end of the coupler is for coupling to an antenna.

11. The radio frequency circuit board according to claim 10, wherein the coupler further comprises:

a second coupling hole and a layer change hole disposed on the PCB, wherein the layer change hole is connected in series between the first coupling hole and the second coupling hole, a first end of the layer change hole is coupled to the second end of the first coupling hole through a first line of a first layer in the PCB, a second end of the layer change hole is coupled to a first end of the second coupling hole through a second line of a second layer in the PCB, and a second end of the second coupling hole is coupled to the isolation end, and wherein in the thickness direction of the PCB, the first end of the second coupling hole and the second end of the layer change hole are close to the first side of the PCB, and the second end of the second coupling hole and the first end of the layer change hole are close to the second side of the PCB.

12. The radio frequency circuit board according to claim 10, wherein the coupler further comprises a layer change hole disposed on the PCB, a first end of the layer change hole is coupled to the first end of the first coupling hole through a first line of a first layer in the PCB, and a second end of the layer change hole is coupled to the coupling end, and wherein in the thickness direction of the PCB, the first end of the layer change hole is close to the first side of the PCB, and the second end of the layer change hole is close to the second side of the PCB.

13. The radio frequency circuit board according to claim 11, wherein a distance between the layer change hole and the main signal hole is greater than a distance between the first coupling hole and the main signal hole.

14. The radio frequency circuit board according to claim 11, wherein a distance between the layer change hole and the main signal hole is greater than a distance between the second coupling hole and the main signal hole.

15. The radio frequency circuit board according to claim 11, wherein a reference ground is disposed between the layer change hole and the main signal hole.

16. The radio frequency circuit board according to claim 11, wherein a reference ground is disposed between the layer change hole and the first coupling hole.

17. The radio frequency circuit board according to claim 11, wherein a reference ground is disposed between the layer change hole and the second coupling hole.

18. An electronic device for wireless communication, comprising:

a radio frequency amplifier;

a duplexer;

an antenna; and a coupler comprising:

a signal input end;

a signal output end;

a coupling end; an isolation end;

a main signal hole disposed on a printed circuit board (PCB) and a first coupling hole disposed on the PCB, wherein the coupler is configured to couple a signal transmitted on a path between the signal input end and the signal output end to a path between the coupling end and the isolation end, a first end of the main signal hole is coupled to the signal input end, a second end of the main signal hole is coupled to the signal output end, a first end of the first coupling hole is coupled to the coupling end, a second end of the first coupling hole is coupled to the isolation end, and in a thickness direction of the PCB, the first end of the first coupling hole and the first end of the main signal hole are close to a first side of the PCB, and the second end of the first coupling hole and the second end of the main signal hole are close to a second side of the PCB, wherein a signal input end of the coupler is coupled to an output end of the radio frequency amplifier and a signal output end of the coupler is coupled to an input end of a duplexer, or the signal input end of the coupler is coupled to an output end of the duplexer and the signal output end of the coupler is coupled to the antenna.

19. The electronic device according to claim 18, further comprising:

a circulator coupled between the signal input end of the coupler and the output end of the radio frequency amplifier.

20. The electronic device according to claim 18, further comprising:

a phase shifter coupled between the signal output end of the coupler and the antenna.

* * * * *